United States Patent [19]

Schwarzbauer et al.

[11] Patent Number: 5,072,312
[45] Date of Patent: Dec. 10, 1991

[54] THYRISTOR WITH HIGH POSITIVE AND NEGATIVE BLOCKING CAPABILITY

[75] Inventors: Herbert Schwarzbauer; Reinhold Kuhnert, both of Munich, Fed. Rep. of Germany

[73] Assignee: Siemens Aktiengesellschaft, Munich, Fed. Rep. of Germany

[21] Appl. No.: 310,960

[22] Filed: Feb. 16, 1989

[30] Foreign Application Priority Data

Mar. 15, 1988 [DE] Fed. Rep. of Germany ....... 3808666

[51] Int. Cl.$^5$ ............................................. H01L 29/74
[52] U.S. Cl. ...................................... 357/38; 357/39; 357/53; 357/55
[58] Field of Search ................. 357/38, 39, 53, 55

[56] References Cited

U.S. PATENT DOCUMENTS

| 4,691,223 | 9/1987 | Murakami et al. | 357/38 |
| 4,901,132 | 2/1990 | Kuwano | 357/38 |
| 4,907,056 | 3/1990 | Goesele et al. | 357/38 |
| 4,942,446 | 7/1990 | Yakushiji | 357/38 |
| 4,963,971 | 10/1990 | Rosetti et al. | 357/38 |

FOREIGN PATENT DOCUMENTS

| 1529195 | 6/1968 | France | 357/38 E |
| 53-145483 | 12/1978 | Japan | 357/55 |
| 57-196570 | 12/1982 | Japan | 357/39 |
| 59-79571 | 5/1984 | Japan | 357/39 |
| 63-9974 | 1/1988 | Japan | 357/38 |
| 63-54768 | 3/1988 | Japan | 357/38 |

OTHER PUBLICATIONS

"Thyristor Design & Realization", by John Wiley & Sons, New York, (1987), pp. 28-35.

Primary Examiner—Rolf Hille
Assistant Examiner—Steven Loke
Attorney, Agent, or Firm—Hill, Van Santen, Steadman & Simpson

[57] ABSTRACT

A thyristor having high forward and reverse blocking capability and a method for the manufacture thereof. The thyristor has a p-base region separated from an n-base lying therebelow by a first planar pn-junction that very gradually approaches an upper side of the thyristor at its edge region. A p-emitter is composed of a p-conductive layer inserted at the under side of the thyristor that is continued in a p-conductive lateral zone that laterally limits the thyristor and extends from an under side up to the upper side. This p-conductive lateral zone merges into a p-conductive semiconductor zone that is inserted at the upper side of the thyristor. This latter p-conductive semiconductor zone extends from a part of the lateral zone lying at the upper side, proceeds along the upper side of the thyristor in the direction toward the edge termination of the p-base region, and is separated from the n-base by a second planar pn-junction that very gradually approaches the upper side.

3 Claims, 2 Drawing Sheets

THYRISTOR WITH HIGH POSITIVE AND NEGATIVE BLOCKING CAPABILITY

BACKGROUND OF THE INVENTION

The present invention is directed to a thyristor having forward and reverse blocking capability, composed of a p-emitter provided with an electrode forming an anode side, of an n-base, of a p-base and of an n-emitter provided with an electrode forming a cathode side. The p-base is composed of a p-conductive base region that is inserted into an n-conductive semiconductor body at an upper side thereof. The p-emitter is composed of a p-conductive semiconductor layer inserted into the semiconductor body at an under side thereof. The n-emitter is formed of at least one n-conductive region inserted into the p-base region. The present invention is also directed to the manufacture of such a thyristor.

A thyristor of this type is disclosed in the text *Thyristor-Handbuch* by A. Hoffmann and K. Stocker, published by Siemens AG, Berlin and Munich, 1965, pp. 37 and 38, particularly FIG. 8.1. Also as described in the book by P. D. Taylor, *Thyristor Design and Realization*, John Wiley and Sons, New York, 1987, pp. 28–35, particularly FIG. 2.4, a pn-junction between the n-base and the p-base is biased in a non-conducting direction when a reverse voltage is applied across the anode and cathode of a thyristor that places the anode at a higher potential than the cathode. By contrast when a reverse voltage is applied across the anode and cathode as a result whereof the cathode is placed at a higher potential than the anode, the pn-junction between the n-base and the p-emitter is biased in a non-conducting direction. When the reverse voltage that is applied exceeds a prescribed limit value that defines the positive blocking capability (forward blocking capability) of the thyristor, then a breakdown occurs at the pn-junction between the n-base and the p-base, the result being that the thyristor undesirably triggers and may be highly thermically loaded under certain circumstances. When, on the other hand, the reverse voltage that is applied exceeds a prescribed limit value that defines the negative blocking capability (reverse blocking capability) of the thyristor, then an avalange breakdown of the pn-junction between the n-base and the p-emitter occurs that generally thermically overloads and thus destroys the thyristor.

At those locations at which the aforementioned pn-junctions reach the semiconductor surface, the electrical field strength increases due to the influence of surface charges and edge geometry. As a result, a premature breakdown occurs at the component edge before the level of blocking capability is reached. There have been attempts to reduce the surface field strengths appearing at the edges of the pn-junctions that are biased in the non-conducting direction.

For increasing the surface-side breakdown voltage of a planar pn-junction that separates a semiconductor region driven into the semiconductor body from the remaining part of the semi-conductor body, European Patent A 0 176 778 discloses the use of a diffusion mask that is provided with smaller, additional openings outside of an opening that laterally defines the semiconductor region. As a result a doping profile derives from drive-in of the dopant that very gradually approaches the boundary surface of the semiconductor body with increasing distance from the edge of the mask opening that defines the semiconductor region.

SUMMARY OF THE INVENTION

An object of the present invention is to provide a thyristor of the type initially cited that has both a high forward blocking capability as well as a high reverse blocking capability despite a simple structure. This is inventively achieved by a thyristor having the p-base region separated from a part of the semiconductor body lying therebelow and forming the n-base by a first planar pn-junction that proceeds parallel to the upper side of the semiconductor body and gradually approaches the upper side at its edge region. The p-conductive semiconductor layer is continued in a p-conductive lateral zone that laterally limits the semiconductor body and extends from the under side up to the upper side thereof. The p-conductive lateral zone merges into a p-conductive semiconductor zone inserted into the semiconductor body at the upper side thereof which proceeds from a part of the p-conductive lateral zone lying at the upper side, and proceeds along the upper side of the semiconductor body in the direction toward an edge termination of the p-base region and which is separated from the part of the semiconductor body lying below the edge termination by a second planar pn-junction that very gradually approaches the upper side.

An advantage of the present invention is that the edge terminations of the two pn-junctions that define the forward and the reverse blocking capability are located on the upper side of the thyristor semiconductor body and can therefore be formed in a simple manner and still provide the desired, high blocking capabilities. Despite a high reverse blocking capability that can be achieved, the entire under side of the thyristor semiconductor body is available for connection to a heat-eliminating substrate wafer of, for example, molybdenum. Further, the edge regions of both blocking pn-junctions, since they are arranged on the same thyristor side, can be more simply protected against high surface field strengths than is the case in prior art thyristors, for example by applying passivation layers of amorphous silicon, glass or SIPOS (semi-insulating polysilicon) or by employing field plates, etc.

Advantageous methods for the manufacture of a thyristor of the invention are also disclosed and claimed.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures in which like reference numerals identify like elements, and in which:

DESCRIPTION OF THE PREFERRED EMBODIMENT

Figure 1:
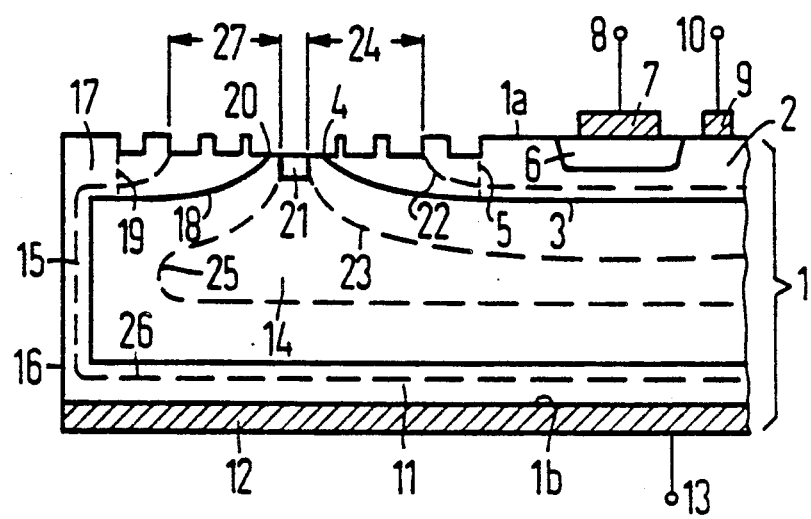
FIG. 1 is a crossection of a thyristor of the present invention.

FIG. 1 shows a crossection through a semiconductor body 1 of, for example, n-doped silicon having a doping concentration of about $10^{13} cm^{-3}$ into which a p-conductive base region 2 is inserted. This is separated from the remaining part of the semi-conductor body 1 by a planar pn-junction 3. The pn-junction 3 is essentially parallel to the upper side 1a of the semiconductor body 1 but very gradually approaches the upper side 1a at its edge region and reaches it in a line 4 proceeding perpendicular to the plane of the drawing that represents the lateral limitation of the base region 2. For example, Aluminum (Al), Gallium (Ga) or Boron (B) can be used as dopant for the base region 2, whereby the doping concentration is approximately $10^{18} cm^{-3}$ in the central part of 2 that lies to the right of the dotted line 5 and continuously decreases within the part of the base region 2 lying to the left of line 5 in the direction toward the lateral limitation 4, so that it has ultimately decreased to a value of about $10^{13} cm^{-3}$ at lateral limitation 4. An n-conductive emitter region 6 is inserted into the base region 2, this n-conductive emitter region 6 being contacted at the upper side 1a of the semiconductor body 1 by an electrode 7 which is the cathode side and provided with a cathode terminal 8. When additional n-conductive emitter regions are inserted into the base region 2, then each of these is contacted by an allocated part of the electrode of the cathode side. These parts are conductively connected to one another and are connected to the terminal 8. The base region 2 is connected to a gate electrode g that is charged with a positive ignition voltage pulse supplied via a terminal 10 for triggering the thyristor. The p-emitter of the thyristor is composed of a p-conductive semiconductor layer 11 inserted into the semiconductor body 1 at an under side thereof. An electrode 12 is the anode side and is provided with an anode terminal 13 which is connected to this p-conductive semiconductor layer 11. The part 14 of the semiconductor body 1 situated under the base region 2 and above the semiconductor layer forms the n-base of the thyristor.

The p-conductive semiconductor layer 11 is continued in a p-conductive lateral zone 15 that is inserted into the semiconductor body 1 at the lateral edge 16 thereof and extends from the under side 1b to the upper side 1a thereof. Further, a p-conductive semiconductor zone 17 inserted into the semiconductor body 1 at the upper side thereof is provided. This p-conductive semiconductor zone 17 extends from the part of the lateral zone 15 that lies at the upper side 1a to the upper side 1a in the direction toward the lateral limitation 4 of the p-base region 2. The semiconductor zone 17 is separated from the part 14 of the semiconductor body 1 by a planar pn-junction 18, whereby the pn-junction 18 proceeds essentially parallel to the upper side 1a and very gradually approaches the upper side 1a only in the region of its right-hand edge termination in FIG. 1. The pn-junction 18 reaches this upper side 1a in the region of a line 20 that proceeds perpendicular to the plane of the drawing. The line 20 thereby represents the lateral limitation of the semiconductor zone 17. The doping concentration of the p-conductive semiconductor layer 11 and of the lateral zone 15 as well as of the part of the semiconductor zone 17 situated to the left of the dotted line 19 is approximately $10^{18} cm^{-3}$. To the right of the line 19, the doping concentration decreases from this value in the direction toward the lateral limitation 20, decreasing to about $10^{13} cm^{-3}$. An n-conductive semiconductor region 21 is advantageously inserted into the part 14 of the semiconductor body 1 roughly in the middle between the lateral limitations 4 and 20 of the p-base region 2 or of the semiconductor zone 17, being inserted such that it extends up to the upper side 1a.

For example, the doping concentration of the semiconductor region 21 can be $10^{18} cm^{-3}$. The recesses at the upper side 1a, visible in FIG. 1 in the region of the edge terminations of the planar pn-junctions 3 and 18, are merely provided for production-associated reasons and shall be set forth in greater detail later.

When a reverse voltage is applied to the terminals 10, 13, then a space charge zone is formed at the pn-junction 3 that is biased in a non-conducting direction, the upper and lower limitations of this space charge zone being indicated by the dotted lines 22 and 23. As a consequence of the pn-junction in the region of the edge termination 4 set forth above, an expansion of the space charge zone 22, 23 occurs at the upper side 1a, whereby the width thereof at the upper side 1a is referenced with the double arrow 24. This width is of such a size that the strength of the surface field appearing at the pn-junction 3 under the influence of the reverse voltage is reduced to such an extent that the desired, high forward blocking capability is achieved.

When a reverse voltage is applied to the terminals 10, 13, then a space charge zone that is indicated by the limiting lines 25 and 26 is formed at the pn-junction 18 that is biased in non-conducting direction in this case and is also formed at the pn-junctions between the parts 11, 15 and 14 that are likewise biased in a non-conducting direction. The double arrow 27 indicates the expansion of the space charge zone at the upper side 1a of the semiconductor body 1 that results due to the pn-junction 18. This expansion produces a reduction in the strength of the surface field appearing at the edge region 20 of the pn-junction 18 to such values that the desired, high reverse blocking capability is achieved.

The n-conductive semiconductor region 21 that is significantly more highly doped than the part 14 of the semiconductor body 1 limits the expansion of the space charge zones 22, 23 and 25, 26 at the upper side 1a. When the region 21 is omitted, then the lateral limitations 4 and 20 must be placed farther apart for identical conditions, so that space charge zones that expand farther into the part 14 of the semiconductor body cannot completely fill up the interspace between the limitations 4 and 20.

Figure 2:
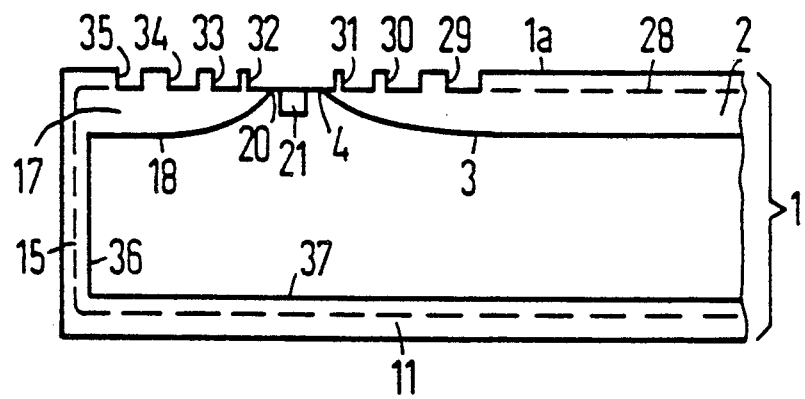
FIG. 2 depicts an intermediate step in the manufacture of the thyristor of the present invention according to a first method.

In the manufacture of the thyristor of FIG. 1, an n-conductive semiconductor body 1 is used and a p-dopant, for example Aluminum, is introduced into a zone proceeding from the boundary surfaces of the semiconductor body 1 according to FIG. 2 that is set off from the remaining part of the semiconductor body 1 by the dotted line 28, being introduced, namely, with a first pre-diffusion step that is also referred to as predeposition. An appropriate diffusion source is used that introduces the dopant into the zone 28 through the boundary surfaces at a prescribed temperature, for example 1060° C., within a prescribed time span, for example a duration of 7 hours. This process can also be an absorption of the semiconductor body 1 by the dopant from a vapor phase in the region of its boundary surfaces. For example, the zone 28 has a penetration depth of 10 μm and an edge-side doping concentration of about $10^{19} cm^{-3}$ in the immediate proximity of the boundary surfaces. In a following method step, the zone 28 is structured in the manner depicted in FIG. 2. Recesses 29 through 35 are provided in the zone 28. In detail, the upper side 1a is first covered with an etching mask that is structured with known photolithographic steps such that it is removed at those locations at which the recesses 29 through 35 are provided. The recesses 29 through 35 extending up to the line 28 are then generated in a following etching process. For a lateral, circular configuration of the semiconductor body 1 that is fashioned as a wafer, the floor areas of the recesses 29 through 35 expediently have the shape of concentric circles. When the width of the individual recesses is referenced w and the distance between two recesses lying next to one another is referenced d, then the size d/w for the recesses 29 through 31 respectively decreases with a progressive approach to the edge termination 4. In an analogous fashion, the size d/w for the recesses 32 through 35 likewise decreases with a progressive approach to the edge termination 20. The recess 32 thereby defines the lateral distance of the edge termination 4 of the p-base region 2 from the edge 20 of the zone 17.

A tempering step that is also referred to as rediffusion then occurs, whereby the semiconductor body shown in FIG. 2 with the diffusion mask removed, is exposed to a temperature of about 1240° C. over a prescribed time span of, for example, 20 hours. According to FIG. 2 the dopant atoms introduced into the zone 28 thereby diffuse out of the parts of the zone 28 and diffuse farther into the semiconductor body 1, so that the indicated pn-junctions 3, 18, 36 and 37 ultimately result. The semiconductor parts 2, 11, 15 and 17 of FIG. 1 are generated as a result thereof. The inner part of the p-base region 2 is thereby formed under that part of the upper side 1a of the semiconductor body 1 that is laterally defined by the recesses 29 through 35. The n-conductive regions 6 and 21 are inserted in a following diffusion step. Connecting the regions 6, 2 and 11 with electrodes 7, 9 and 12 then follows.

The manufacturing method set forth with reference to FIG. 2 corresponds in part to the method for manufacturing a pn-junction that is recited in European Patent reference EP A 0 262 356.

Figure 3:
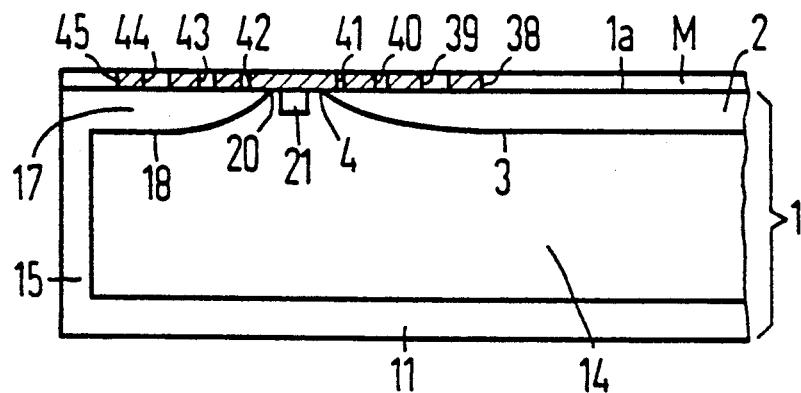
FIG. 3 depicts an intermediate step in the manufacture of the thyristor of the present invention according to a second method.

FIG. 3 illustrates a different method for the manufacture of a thyristor according to the present invention. The upper side 1a of the semiconductor body 1 is provided with a doping mask M in which openings 38 through 45 are provided. The openings 38 through 41 are dimensioned respectively smaller with an increasing approach to the line 4. The openings 42 through 44 are likewise dimensioned respectively smaller with an increasing approach to the line 20. In detail, the opening 38 defines the inner part of the p-base region, whereas further, significantly smaller openings 39 through 41 define the edge region of 2. The opening 45 at the edge side defines the main part of the p-conductive semiconductor zone 17, whereas the significantly smaller openings 42 through 44 define the edge region of 17. The dopant required for the formation of the regions 2, 11, 15 and 17 is thereby introduced into the semiconductor body 1 with a diffusion step such that the pn-junctions 3 and 18 as well as those between the parts 11, 15 and 14 directly result. After the doping mask M has been removed, the regions 6 and 21 are inserted in the manner already set forth and the regions 6, 2 and 11 are provided with the electrodes 7, 9 and 12. A related manufacturing method is disclosed in European patent reference EP-A 0 176 778.

Figure 4:
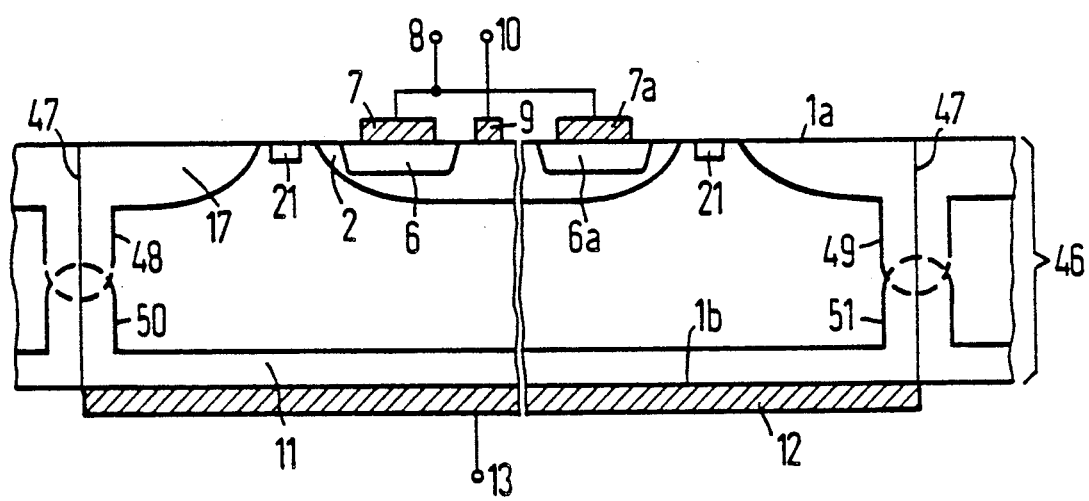
FIG. 4 depicts another thyristor of the present invention.

When the manufacture of thyristors of the present invention uses a wafer-like, n-conductive semiconductor body 46 shown in FIG. 4 that is provided for a plurality of such thyristors, then p-separating diffusions are inserted in a known process at the boundary surfaces 47 that separate the individual thyristors from one another. That is, the masked drive-in of p-dopant with which the p-diffusion regions 48 and 49 are inserted proceed from the upper side 1a and the p-diffusion regions 50 and 51 are inserted proceeding from the under side 1b of the semiconductor body. The penetration depths of the regions 48 and 50 are thereby selected of such a size that a through, p-conductive diffusion region 48, 50 derives. The regions 49 and 51 likewise form a through diffusion region 49, 51. Subsequently, all thyristors contained in the semiconductor body 46 can be subsequently subjected to the method steps that were explained with reference to FIG. 2 or with reference to FIG. 3. It is assumed in FIG. 4 that the regions 2, 17 and 11 as well as the n-emitter regions 6 and 6a had been generated in accordance with the method steps set forth with reference to FIG. 2 or with reference to FIG 3. The regions 21 have thereby also been inserted in the manner already set forth. Following thereupon, the individual thyristors are then separated from one another along the boundary surfaces 47, for example by laser irradiation, by sawing or the like. The connection of the electrodes 7, 9 and 11 then follows, whereby an electrode part 7a that is applied to the terminal 8 together with the electrode 7 is provided for the n-emitter region 6a. In the embodiment of a thyristor of the present invention shown in FIG. 4, those parts lying at the boundary surfaces 47 of the p-diffusion regions 48 and 50 or 49 and 51 have been roughly halved by the parting procedure and form the lateral zones 15 of the thyristor.

Instead of the aforementioned diffusion steps, corresponding implantation steps can also be utilized in the manufacturing method of the present invention in order to define the p-conductive regions in the semiconductor body 1. In particular, corresponding deep implantations or high-energy implantations can replace the separating diffusion regions 48 and 51.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A thyristor having forward and reverse blocking capability, composed of a p-emitter region provided with an anode electrode, an n-base region, a p-base region and an n-emitter region provided with a cathode electrode, whereby the p-base region is composed of a p-conductive base region that is inserted into an n-conductive semiconductor body at an upper side thereof, whereby the p-emitter region is composed of a p-conductive semiconductor layer inserted into the semiconductor body at an under side thereof, and whereby the n-emitter region is formed of at least one n-conductive region inserted into the p-base region, comprising the p-base region separated from a part of the semiconductor body lying therebelow and forming the n-base region by a first planar pn-junction that proceeds parallel to the upper side of the semiconductor body and gradually approaches the upper side at its edge region; and the p-conductive semiconductor layer continued in a p-conductive lateral zone that laterally limits the semiconductor body and extends from the under side up to the upper side thereof, said p-conductive lateral zone merging into a p-conductive semiconductor zone inserted into the semiconductor body at the upper side thereof which proceeds from a part of the p-conductive lateral zone lying at the upper side, and proceeds along the upper side of the semiconductor body in the direction toward an edge termination of the p-base region and which is separated from the part of the semiconductor body lying below the edge termination by a second planar pn-junction that has a first part extending from substantially the part of the p-conductive lateral zone lying at the upper side and that has a second part extending from the first part to a juncture with the upper side, the first part extending substantially parallel to the upper side, and the second part very gradually approaching the upper side.

2. The thyristor according to claim 1, wherein an n-conductive region is inserted into the part of the semiconductor body that forms the n-base region, being inserted there into at the upper side of the semiconductor body between the edge termination of the p-base region and the p-conductive semiconductor zone.

3. A thyristor having forward and reverse blocking capability, composed of a p-emitter region provided with an anode electrode, an n-base region, a p-base region and an n-emitter region provided with a cathode electrode, whereby the p-base region is composed of a p-conductive base region that is inserted into an n-conductive semiconductor body at an upper side thereof, whereby the p-emitter region is composed of a p-conductive semiconductor layer inserted into the semiconductor body at an under side thereof, and whereby the n-emitter region is formed of at least one n-conductive region inserted into the p-base region, comprising the p-base region separated from a part of the semiconductor body lying therebelow and forming the n-base region by a first planar pn-junction that proceeds parallel to the upper side of the semiconductor body and gradually approaches upper side at its edge region; and the p-conductive semiconductor layer continued in a p-conductive lateral zone that laterally limits the semiconductor body and extends from the under side up to the upper side thereof, said p-conductive lateral zone merging into a p-conductive semiconductor zone inserted into the semiconductor body at the upper side thereof which proceeds from a part of the p-conductive lateral zone lying at the upper side, and proceeds along the upper side of the semiconductor body in the direction toward an edge termination of the p-base region and which is separated from the part of the semiconductor body lying below the edge termination by a second planar pn-junction that has a first part extending from substantially the part of the p-conductive lateral zone lying at the upper side and that has a second part extending from the first part to a juncture with the upper side, the first part extending substantially parallel to the upper side, and the second part very gradually approaching the upper side, and an n-conductive region inserted into the part of the semiconductor body that forms the n-base region, being inserted there into at the upper side of the semiconductor body between the edge termination of the p-base region and the p-conductive semiconductor zone.

* * * * *